(12) United States Patent
Janik

(10) Patent No.: US 11,962,144 B2
(45) Date of Patent: Apr. 16, 2024

(54) SYSTEM AND METHOD FOR A PHOTOVOLTAIC SYSTEM PROGRAMMABLE DYNAMIC CIRCUIT BREAKER

(71) Applicant: Electronic Power Design, Inc., Houston, TX (US)

(72) Inventor: John Bradford Janik, Houston, TX (US)

(73) Assignee: Electronic Power Design, Inc., Houston, TX (US)

(*) Notice: Subject to any disclaimer, the term of this patent is extended or adjusted under 35 U.S.C. 154(b) by 6 days.

(21) Appl. No.: 17/958,847

(22) Filed: Oct. 3, 2022

(65) Prior Publication Data
US 2023/0163589 A1 May 25, 2023

Related U.S. Application Data

(63) Continuation of application No. 17/156,795, filed on Jan. 25, 2021, now Pat. No. 11,462,902.

(60) Provisional application No. 62/964,765, filed on Jan. 23, 2020.

(51) Int. Cl.
| | |
|---|---|
| H02H 7/00 | (2006.01) |
| H01L 31/054 | (2014.01) |
| H01L 31/055 | (2014.01) |
| H02H 1/00 | (2006.01) |
| H02H 7/20 | (2006.01) |
| H02S 40/30 | (2014.01) |

(52) U.S. Cl.
CPC .......... *H02H 7/20* (2013.01); *H01L 31/0547* (2014.12); *H01L 31/055* (2013.01); *H02H 1/0007* (2013.01); *H02H 1/0092* (2013.01); *H02S 40/30* (2014.12)

(58) Field of Classification Search
None
See application file for complete search history.

(56) References Cited

U.S. PATENT DOCUMENTS

| | | | | |
|---|---|---|---|---|
| 9,765,178 | B2* | 9/2017 | Duerksen | G02B 6/02033 |
| 11,462,902 | B2* | 10/2022 | Janik | H02H 3/006 |
| 2009/0014056 | A1* | 1/2009 | Hockaday | H01L 31/035281 |
| | | | | 136/246 |

(Continued)

*Primary Examiner* — Stephen W Jackson
(74) *Attorney, Agent, or Firm* — G. Michael Roebuck, PC

(57) ABSTRACT

A photovoltaic array of photovoltaic solar cells; a smart dynamic programmable circuit breaker for electrically providing a pulsed 100 microseconds duration short circuit to the photovoltaic array electrical outputs, wherein a response time for the smart dynamic programmable circuit breaker is more than 1 millisecond when responding to a short circuit; a computer program comprising instructions that when executed by the processor perform functions that control the smart dynamic programmable circuit breaker, the computer program comprising: instructions to command the smart dynamic programmable circuit breaker to initiate the 100 microsecond pulsed short circuit; instructions to measure a current magnitude and current rise time of the smart photovoltaic system outputs during the 100 microsecond pulsed short circuit; and instructions to select a behavior curve from a plurality of smart dynamic programmable circuit breaker behavior curves 10% above the current magnitude and current rise time during the pulsed short circuit.

7 Claims, 1 Drawing Sheet

(56) References Cited

U.S. PATENT DOCUMENTS

2016/0145378 A1\* 5/2016 Duerksen ............ C08G 59/022
522/170

\* cited by examiner

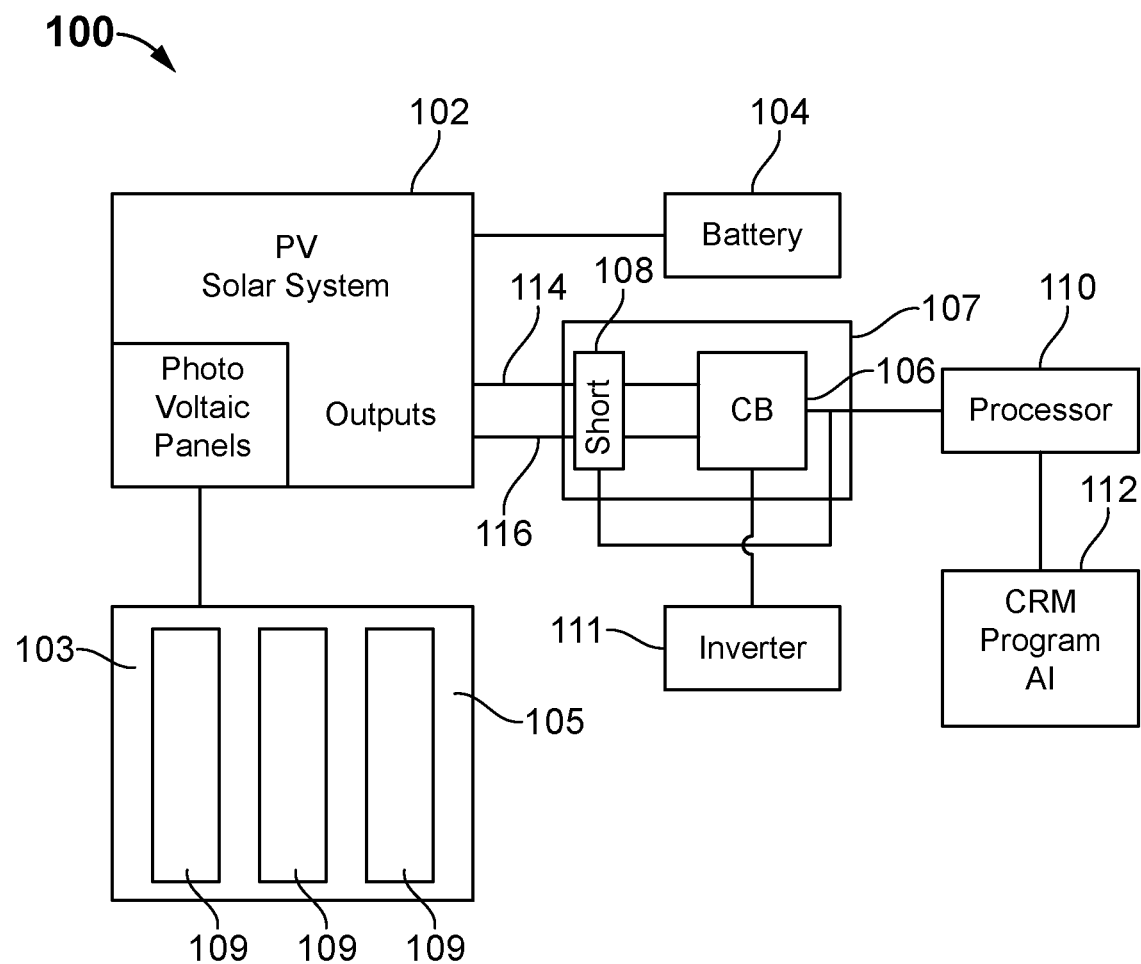

SYSTEM AND METHOD FOR A PHOTOVOLTAIC SYSTEM PROGRAMMABLE DYNAMIC CIRCUIT BREAKER

CROSS REFERENCE TO RELATED APPLICATIONS

This patent applications claims priority from U.S. Provisional Patent Application Ser. No. 62/964,765 by Janik, entitled "A SYSTEM AND METHOD FOR A HYBRID PULSED POWER METER" filed on Jan. 23, 2020, which is hereby incorporated by reference in its entirety.

BACKGROUND OF THE INVENTION

Fuses blow to protect circuits from too much current and burning up or damaging electrical components. There is a need for a circuit breaker for photovoltaic arrays.

Field of the Invention

Circuit breakers for solar installations.

SUMMARY OF THE INVENTION

A system and method for a hybrid pulsed circuit breakers for solar installations.

BRIEF DESCRIPTION OF THE DRAWINGS

FIG. 1 is schematic diagram of an illustrative embodiment of the invention.

DETAILED DESCRIPTION OF AN ILLUSTRATIVE EMBODIMENT OF THE INVENTION

Fuses blow to protect circuits from too much current and burning up or damaging electrical components. This turns out to be very hard to do with solar installations. So much so, that the major fuse manufacturers had to develop "special", super sensitive and expensive "solar" fuses for photovoltaic systems. Thus, there is a need for a circuit breaker for a photovoltaic system.

If you take a solar panel and hold the wires in your hand open circuit, the panel simply make a low DC Open Circuit voltage. If you touch the wires together into a short circuit, nothing visible happens. No spark, no damage, no nothing. The panel simply makes Short Circuit Current. This is super hard to protect because, unlike rotating machinery like motors and generators, there is no "extra short circuit current" developed. In rotating equipment, there is a tremendous amount of Stored Energy in the Electric and Magnetic fields and all of this Energy is released when a short circuit occurs. Many times this energy is a short duration current spike that is 5 to 30 times as much as the full load 100% rating. That means that you get a 500% to 3,000% current spike and this makes it super EASY to blow a fuse or trip a circuit breaker. Also, when connected to a very large utility, there is tremendous energy available in the form of Short Circuit Current to blow a fuse or trip a circuit breaker.

In solar systems such a photovoltaic systems (PV systems), there is less current available to trip a circuit breaker, however, when there is some "stored energy" available, sort of like with the electric and magnetic fields of rotating machines, but with batteries in this case, circuit protection is easier to accomplish.

In a particular illustrative embodiment of the invention, the system and method integrates this knowledge of the stored energy available into the protection circuit. So pulsing the circuit with quick short circuits intentionally (very short—100 microseconds, shorter than a circuit breaker's reaction time on the order of milliseconds), a processor monitors the impedance and short circuit current rise time to interpolate the realizable short circuit coordination curves that are applicable for the photovoltaic system. The 100 nano seconds pulse duration is too fast to trip a breaker that typically requires milliseconds to react to the nanoseconds long pulse. The system and method use the microseconds duration pulse to determine how much current the system is responding to set the breaking point trip (trigger) point voltage and overcurrent. The circuit breaker trip or trigger voltage and overcurrent are lowered to reduce the time for the circuit breaker to open the circuit and break sooner, substantially lowering the time the circuit breaker reacts to the lowered trigger voltage. The available current from the PV system varies over time and is sample periodically to stay informed of how much current to which the system is responding and the circuit breaker trip voltage set at the current level at which the circuit is responding during the microsecond short circuit pulse.

Turning now to FIG. 1, in a particular illustrative embodiment of the invention, a photovoltaic system 100 including but not limited to a photovoltaic array of photovoltaic cells (also referred to herein as "solar cells") 109 mounted on a photo reactive back plane 105, a power storage battery 104 and a programmable dynamic circuit breaker 107 comprising a short circuit pulse device 108 and a programmable circuit breaker 106 are provided. A processor 110 connected to a computer readable medium 112 containing instructions executed by the processor is also provided that controls the programmable dynamic circuit breaker. The processor commands the dynamic programmable circuit breaker to generate a pulsed 100 microsecond circuit between output terminals 114 and 116 from the solar array. An inverter 111 is provided sharing the same circuit breaker and batter with the PV system. The battery provides power in the solar array so that the short circuit generates a short circuit current which the processor senses. The current generated by the PV array of solar cells is also sensed during the short circuit pulse. The processor also senses the voltage output from the PV system and an impedance of the PV system. The pulsed short circuit has a duration that is an order of magnitude faster than a response time for the circuit breaker. For example, in a particular illustrative embodiment, for a dynamic programmable circuit breaker response time of 1 millisecond, the pulsed short circuit has a duration of 100 microseconds. The 100 microsecond pulsed short circuit enables the processor to measure the overcurrent caused by the pulsed short circuit and the rise time of the overcurrent during the pulsed short circuit. In another particular embodiment, the pulsed short circuit duration is adjusted to be longer duration to allow inductive and capacitive elements in the PV system to settle in electrically as long as the pulsed short circuit duration is short enough to prevent tripping the dynamic programmable circuit breaker.

A default for a dynamic programmable circuit breakers is typically 150% to 500% of the normal operating current for the solar array. The processor lowers the overcurrent tripping value down to 10% above the pulsed short circuit overcurrent measured during the pulsed short circuit. The lowered overcurrent tripping value enables the dynamic programmable circuit breakers to react faster to an actual short circuit in the PV system and better protects the solar array and attached electrical components during a short circuit by reacting faster than the circuit breaker would be able to react at the default setting. The rise time of the pulsed overcurrent is measured and the delay time for the electronic circuit breaker is adjusted to 10% longer than the rise time to quicken the response of the circuit breaker to an overcurrent.

Dynamic programmable circuit breakers provide programmable and basic adjustable tripping settings. Each of these adjustable settings actually shape the time-current curve of a circuit breaker and enable improved tripping according to the current impedance of a photovoltaic array having a photo reactive backplane. In a particular illustrative embodiment of the invention, the photoreactive backplane reflects, retains, and emits light that passed by photovoltaic cells mounted on the photo reactive backplane.

The voltage output, current output, and impedance of a photo voltaic system (PV system) having a battery and circuit breaker varies with the amount of current being output by the PV system. The amount of current output from the PV system varies with the amount of sunlight striking the PV system PV array of solar cells and the level of charge on the battery or electrical power storage unit in the PV system. The more sunlight striking the PV array, the more current and voltage output by the PV system.

A smart dynamic programmable circuit breakers is provided in a particular illustrative embodiment of the invention to protect the PV system from damage due to short circuits. In a particular illustrative embodiment of the invention, a processor provides a command to the smart dynamic circuit breaker to initiate a short circuit pulse duration that is significantly shorter duration than a reaction time of the circuit breaker. Thus, the processor produces the short circuit and measures the impedance of the PV system along with the rise time and magnitude of current generated in the PV systems due to the short circuit. The impedance, voltage and short circuit current for the PV systems varies over time based on the amount of sunlight hitting the PV system. In a particular embodiment of the invention the short circuit pulse is 100 microseconds for a circuit breaker with a minimum reaction time of 500 milliseconds. The processor determines the impedance, current magnitude and current rise time of the short circuit current adjusts the dynamic programmable circuit breaker to match the short circuit behavior of the PV system to provide a quicker breaker response time under varying PV system conditions that affect the short circuit behavior rise time also referred to herein as a characteristic curve.

In adjusting the behavior of the programmable dynamic circuit breaker the processor adjust the tripping parameters to match the PV system characteristic short circuit current response curve at the current time, during a changing impedance and short circuit profile for the PV system. Each circuit breaker has a family of behavior curves that are a graphical representation of the circuit breaker's response to a particular current level and the circuit breaker's response behavior. The processor picks the circuit breaker response time behavior curve that most closely matches the PV system's short circuit response at a given time. In a particular illustrative embodiment of the invention, the circuit breakers response time behavior is selected for a tripping voltage 10% above the short circuit current and 10% above the rise time of the short circuit. The processor samples the short circuit response of the PV system periodically and periodically adjusts the response time behavior of the smart dynamic circuit breaker that matches one of a plurality of behavior curves for the smart dynamic circuit breaker.

In another particular illustrative embodiment of the invention, the programmable dynamic circuit breaker has programmable parameters that include but are not limited to Continuous Amps (Ir). Long-Time Delay, Short-Time Pickup, Short-Time Delay, Instantaneous Pickup and Ground Fault Pickup, which are adjusted based on the characteristic curve for the smart to match the current short circuit current determined by the processor during the periodic short circuits monitored by the processor. Each setting affects the behavior curve for the smart circuit breaker.

In a particular illustrative embodiment of the invention, a battery system is mounted near the solar panels but not on the solar panels. The battery system is near enough to the PV array to be able to utilize the electrical infrastructure of the solar inverters, transformers, and cable systems for both the solar panels and the batteries. In a particular illustrative embodiment of the invention, the battery system is mounted within 3 feet of the solar panels. As discussed, this could save the cost of redundant electrical infrastructure if one system were used for photovoltaic (PV) Solar Panels and another for the Stored Energy! Stored Energy does not necessarily need to be in the form of a battery either. In another particular embodiment of the invention, a flywheel is provided to store energy in the PV system. Additional energy storage means can also be used. The other problem is the case with Ground Detection. On "normal" electrical installations, one typically will "megger" (measure the resistance in ohms of) a motor winding. For example, to see if the meg-ohms to ground are high enough to give the operator confidence that there will not be a short circuit condition to ground once the motor is energized. There are "rules of thumb", as well as guidelines that are typically used. For example, a company may tell their electrical department, to NOT energize the motor if it "megs" less than 10 Meg-Ohms to ground. This is fine for checking to see if this one circuit is ok to energize. But what if there are 10 motors connected in parallel (not normal) and they all are "ok" with 10 Meg-Ohms to ground. The one simple measurement will read 10 each, 10 Meg-ohms circuits in parallel and yield a measurement reading of 1 Meg-Ohm even though all motors are really ok. Now take this to an extreme with 1,000's of solar panels! Every panel is very insulated from ground with Gig-Ohms to ground, but the "SYSTEM" reads a dead short to ground.

The solar panel(s) and battery utilize the same cables, inverters, transformers, and other "solar" infrastructure simultaneously at zero additional cost to add stored energy. In a particular illustrative embodiment of the invention, a battery chemistry that is low cost, low power, high energy with no rare earth constituents such as cobalt is used and uses aluminum as a conductor as part of the stored energy design.

In another particular illustrative embodiment of the invention, the PV array is mounted on a photoreactive back plane. In a particular embodiment, a highly polished aluminum is used as a reflector on the back plane of the solar panel to reflect escaping photons that have passed through the top of the solar panel are subsequently reflected by the reflective back plane and back through the back of the solar panel to increase absorption of photons in the PV array and therefore efficiency of the PV array (also referred to as a "solar panel"). The stored energy medium (battery, et al.) can be constructed of a thin film polymer that can be applied with a vapor deposition technique, similar to the solar film technology that commercially available First Solar uses to make glass panels. This idea would also give the solar panel more short circuit current available which would greatly enhance Fusible Protection, presently a very difficult proposition. In another particular embodiment of the invention, a layer of phosphorus (like on an analog oscilloscope having a phosphorescent coating) or Strontium Aluminate is added on the back of a solar panel to "store" the photonic glow for re-harvesting energy of photons stored in phosphorus so that photos are re-harvested from the light emitted by the phosphorescent back plane. In addition to storing the energy to "store the light" to make the PV panels more powerful by adding additional light from the phosphorescent back plane.

Dynamic programmable circuit breakers provide programmable and basic adjustable tripping settings. Each of these adjustable settings actually shape the time-current curve of a circuit breaker and enable improved tripping according to the current impedance of a photovoltaic array having a photo reactive backplane. The photoreactive phosphorescent backplane reflects, retains, and emits light that passed by photovoltaic cells mounted on the photo reactive backplane.

The voltage output, current output, and impedance of a photo voltaic (PV) array system (PV system) having a battery and circuit breaker varies with the amount of current being output by the PV array. The amount of current output from the PV array varies with the amount of sunlight striking the PV array and the level of charge on the battery or electrical power storage unit in the PV system. The more sunlight striking the PV array, the more current and voltage output by the PV system.

A programmable dynamic circuit breaker is provided in a particular illustrative embodiment of the invention to protect the PV system from damage due to short circuits. In a particular illustrative embodiment of the invention, a processor provides a command to the smart dynamic circuit breaker to initiate a short circuit pulse duration that is significantly shorter duration than a reaction time of the circuit breaker. Thus, the processor produces the short circuit and measures the impedance of the PV system along with the rise time and magnitude of current generated in the PV systems due to the short circuit. The impedance, voltage and short circuit current for the PV systems varies over time based on the amount of sunlight hitting the PV system. In a particular embodiment of the invention the short circuit pulse is 100 microseconds for a circuit breaker with a minimum reaction time of 500 milliseconds.

The processor determines the impedance, current magnitude and present rise time of the short circuit current adjusts the dynamic programmable circuit breaker to match the short circuit behavior of the PV system to provide a quicker breaker response time under varying PV system conditions that affect the short circuit behavior rise time also referred to herein as a characteristic curve.

In adjusting the behavior of the smart dynamic circuit breaker the processor adjusts the tripping parameters to match the PV system characteristic curve at the current time, during a changing impedance and short circuit profile for the PV system. Each circuit breaker has a family of behavior curves that are a graphical representation of the circuit breaker's response to a particular current level and the circuit breaker's response behavior. The processor picks the circuit breaker response time behavior curve that most closely matches the PV system's short circuit response at a given time. The processor samples the short circuit response of the PV system periodically and periodically adjusts the behavior smart dynamic circuit breaker that matches one of a plurality of behavior curves for the smart dynamic circuit breaker. In another particular illustrative embodiment of the invention, The smart dynamic circuit breaker has programmable parameters that include but are not limited to Continuous Amps (Ir). Long-Time Delay, Short-Time Pickup, Short-Time Delay, Instantaneous Pickup and Ground Fault Pickup, which are adjusted based on the characteristic curve for the smart to match the current short circuit current determined by the processor during the periodic short circuits monitored by the processor. Each setting affects the behavior curve for the smart circuit breaker.

A protection relay for an electrical switching apparatus for a load includes a number of voltage sensors structured to sense voltage applied to the load, a number of current sensors structured to sense current flowing to the load, and a processor cooperating with the number of voltage sensors and the number of current sensors. The processor determines a fault current available at the load during the puked short circuit. An output cooperates with the processor. The output is structured to output the determined fault current and a number of incident energy at the electrical switching apparatus, and a personal protective equipment level operatively associated with the electrical switching apparatus. The processor determines from the determined fault current the number of the incident energy at the electrical switching apparatus, and the personal protective equipment level operatively associated with the electrical switching apparatus. U.S. Pat. No. 8,493,012B2 Protection relay, electrical switching apparatus, and system for determining and outputting fault current available at a load and incident energy or personal protective equipment level operatively associated therewith, which is incorporated by reference in its entirety herein, discloses a protection relay for an electrical switching apparatus for a load includes a number of voltage sensors structured to sense voltage applied to the load, a number of current sensors structured to sense current flowing to the load, and a processor cooperating with the number of voltage sensors and the number of current sensors. The processor determines a fault current available at the load. An output cooperates with the processor. The output is structured to output the determined fault current and a number of incident energy at the electrical switching apparatus, and a personal protective equipment level operatively associated with the electrical switching apparatus. The processor determines from the determined fault current the number of the incident energy at the electrical switching apparatus, and the personal protective equipment level operatively associated with the electrical switching apparatus.

A photovoltaic system is disclosed, the system including but not limited to a photovoltaic array of photovoltaic cells (solar cells) mounted on a photo reactive back plane; a programmable dynamic programmable circuit breaker for electrically providing a pulsed 100 microseconds duration short circuit to a set of photovoltaic system electrical outputs, wherein a response time for the smart dynamic programmable circuit breaker is more than 1 millisecond when responding to a short circuit; a processor in data communication with a computer readable medium containing a computer program comprising instructions that when executed by the processor perform functions that control the smart dynamic programmable circuit breaker, the computer program including but not limited to instructions to command the smart dynamic programmable circuit breaker to initiate the 100 microsecond pulsed short circuit on electrical outputs of the programmable photovoltaic system; instructions to measure a current magnitude and current rise time of the smart photovoltaic system outputs during the 100 microsecond pulsed short circuit; and instructions to select a behavior curve from a plurality of smart dynamic programmable circuit breaker behavior curves 10% above the current magnitude and current rise time during the pulsed short circuit, that most closely matches the measured magnitude and current rise time of the photovoltaic system during the pulsed short circuit. In another particular illustrative embodiment of the invention, the photo reactive back plane is reflective so that sunlight that passes by the photovoltaic array is reflected back onto the photovoltaic cells for generating additional voltage from the photovoltaic array. In another particular illustrative embodiment of the invention, the photo reactive back plane is phosphorescent so that sunlight that passed by the photovoltaic array generates additional light back onto the photovoltaic cells for generating additional voltage from the photovoltaic array. In another particular illustrative embodiment of the invention, the pulsed short circuit duration is 100 microseconds and a minimum reaction time the smart dynamic programmable circuit breaker is 500 microseconds so that the smart dynamic programmable circuit breaker cannot react to the pulsed short circuit duration.

In another particular illustrative embodiment of the invention, a photovoltaic system is disclosed, the system including but not limited to a photovoltaic array of photovoltaic solar cells; a smart dynamic programmable circuit breaker for electrically providing a pulsed 100 microseconds duration short circuit to a set of photovoltaic system electrical outputs, wherein a response time for the smart dynamic programmable circuit breaker is more than 1 millisecond when responding to a short circuit; and a processor in data communication with a computer readable medium containing a computer program comprising instructions that when executed by the processor perform functions that control the smart dynamic programmable circuit breaker, the computer program including but not limited to instructions to command the smart dynamic programmable circuit breaker to initiate the 100 microsecond pulsed short circuit on electrical outputs of the smart photovoltaic system; instructions to measure a current magnitude and current rise time of the smart photovoltaic system outputs during the 100 microsecond pulsed short circuit; and instructions to select a behavior curve from a plurality of smart dynamic programmable circuit breaker behavior curves 10% above the current magnitude and current rise time during the pulsed short circuit, that most closely matches the measured magnitude and current rise time of the photovoltaic system during the pulsed short circuit.

In another particular illustrative embodiment of the invention an apparatus is disclosed, the apparatus including but not limited to a photovoltaic array of photovoltaic solar cells; and a photo reactive back plane, wherein the photovoltaic cells are mounted onto the photo reactive back plane. In another particular illustrative embodiment of the invention the photo reactive back plane is reflective so that sunlight that passes by the photovoltaic array is reflected back onto the photovoltaic cells for generating additional voltage from the photovoltaic array. In another particular illustrative embodiment of the invention the photo reactive back plane is phosphorescent so that sunlight that passed by the photovoltaic array generates additional light back onto the photovoltaic cells for generating additional voltage from the photovoltaic array.

The invention claimed is:

1. A non-transitory computer readable medium comprising:

a computer program containing instructions stored in the non-transitory computer readable medium, the computer program further comprising, instructions to command a smart dynamic programmable circuit breaker to initiate a 100 microsecond pulsed short circuit on electrical outputs of a smart photovoltaic system;

instructions to measure a current magnitude and current rise time of the smart photovoltaic system that outputs during the 100 microsecond pulsed short circuit; and instructions to select a behavior curve from a plurality of smart dynamic programmable circuit breaker behavior curves 10% above the current magnitude and current rise time during the pulsed short circuit, that most closely matches the measured magnitude and current rise time of the photovoltaic system during the pulsed short circuit.

2. The non-transitory computer readable medium of claim 1, wherein the photo reactive back plane is reflective so that sunlight that passes by the photovoltaic array is reflected back onto the photovoltaic cells for generating additional voltage from the photovoltaic array.

3. The non-transitory computer readable medium of claim 1, wherein the photo reactive back plane is phosphorescent so that sunlight that passed by the photovoltaic array generates additional light back onto the photovoltaic cells for generating additional voltage from the photovoltaic array.

4. The non-transitory computer readable medium of claim 1, wherein the pulsed short circuit duration is 100 microseconds and a minimum reaction time the smart dynamic programmable circuit breaker is 500 microseconds so that the smart dynamic programmable circuit breaker cannot react to the pulsed short circuit duration.

5. A system, the system comprising:

a smart dynamic programmable circuit breaker for electrically providing a pulsed 100 microseconds duration short circuit to a set of photovoltaic system electrical outputs, wherein a response time for the smart dynamic programmable circuit breaker is more than 1 millisecond when responding to a short circuit; and a processor in data communication with a computer readable medium containing a computer program comprising instructions that when executed by the processor perform functions that control the smart dynamic programmable circuit breaker, the computer program comprising:

instructions to command the smart dynamic programmable circuit breaker to initiate the 100 microsecond pulsed short circuit on electrical outputs of the smart photovoltaic system;

instructions to measure a current magnitude and current rise time of the smart photovoltaic system outputs during the 100 microsecond pulsed short circuit; and instructions to select a behavior curve from a plurality of smart dynamic programmable circuit breaker behavior curves 10% above the current magnitude and current rise time during the pulsed short circuit, that most closely matches the measured magnitude and current rise time of the photovoltaic system during the pulsed short circuit.

6. An apparatus, the apparatus comprising:

a photo reactive back plane, wherein photovoltaic solar cells are mounted onto the photo reactive back plane, wherein the photo reactive back plane is reflective so that sunlight that passes by the photovoltaic array is reflected back onto the photovoltaic cells for generating additional voltage from the photovoltaic array.

7. The apparatus of claim 6, wherein the photo reactive back plane is phosphorescent so that sunlight that passed by the photovoltaic array generates additional light back onto the photovoltaic cells for generating additional voltage from the photovoltaic array.

\* \* \* \* \*